(12) United States Patent
Puma

(10) Patent No.: US 7,817,970 B2
(45) Date of Patent: Oct. 19, 2010

(54) TRANSMITTING/RECEIVING DEVICE HAVING A POLAR MODULATOR WITH VARIABLE PREDISTORTION

(75) Inventor: Giuseppe Li Puma, Bochum (DE)

(73) Assignee: Infineon Technologies AG, Neubiberg (DE)

( * ) Notice: Subject to any disclaimer, the term of this patent is extended or adjusted under 35 U.S.C. 154(b) by 761 days.

(21) Appl. No.: 11/349,594

(22) Filed: Feb. 8, 2006

(65) Prior Publication Data

US 2006/0178120 A1 Aug. 10, 2006

(30) Foreign Application Priority Data

Feb. 10, 2005 (DE) .................. 10 2005 006 162

(51) Int. Cl.
*H04B 1/04* (2006.01)
*H01Q 11/12* (2006.01)

(52) U.S. Cl. .................. 455/114.3; 455/126; 455/127.2

(58) Field of Classification Search .............. 455/114.2, 455/114.3, 115.1, 115.2, 127.1, 127.2, 226.1, 455/226.2, 226.3, 126; 375/296, 297; 330/149
See application file for complete search history.

(56) References Cited

U.S. PATENT DOCUMENTS

| | | | | |
|---|---|---|---|---|
| 5,524,285 | A * | 6/1996 | Wray et al. | 455/126 |
| 6,366,177 | B1 | 4/2002 | McCune et al. | 332/103 |
| 6,847,259 | B2 * | 1/2005 | Kenington | 330/149 |
| 7,346,122 | B1 * | 3/2008 | Cao | 375/296 |
| 2002/0025789 | A1 * | 2/2002 | Hayashihara | 455/115 |
| 2002/0196864 | A1 * | 12/2002 | Booth et al. | 375/296 |
| 2004/0208157 | A1 | 10/2004 | Sander et al. | 370/345 |
| 2005/0001679 | A1 * | 1/2005 | Saed | 330/149 |
| 2005/0070234 | A1 * | 3/2005 | Jensen | 455/126 |
| 2005/0148304 | A1 * | 7/2005 | Jerng | 455/75 |
| 2005/0157813 | A1 * | 7/2005 | Cope et al. | 375/297 |
| 2006/0091949 | A1 * | 5/2006 | Smithson | 330/149 |

FOREIGN PATENT DOCUMENTS

| | | |
|---|---|---|
| JP | 11004124 | 1/1999 |
| JP | 2004104194 | 4/2004 |
| JP | 2005012419 | 1/2005 |
| WO | 0158012 | 8/2001 |
| WO | 2005004323 | 1/2005 |

OTHER PUBLICATIONS

Kahn, Leonard R.; Single-Sideband Transmission by Envelope Elimination and Restoration; Proceedings of the I.R.E.; pp. 803-806, Jul. 1952.
Sander, Wendell B. et al.; Polar Modulator for Multi-mode Cell Phones; Proc. IEEE Custom Integrated Circuits Conference; pp. 439-445, Sep. 2003.
A translation of JP Office Action for Japanese Patent Application No. 2006-033267 mailed Feb. 26, 2008 (6 pages).

* cited by examiner

*Primary Examiner*—Nguyen Vo
(74) *Attorney, Agent, or Firm*—Dicke, Billig & Czaja, PLLC

(57) ABSTRACT

The transmitting/receiving device has a polar modulator with a variable predistorter (11, 12) and an amplifier (8) which can be modulated, a reception path (25) which can be operated both during conventional reception and for the purposes of adjustment of the predistorter (11, 12) in order to determine a measurement signal (35) which is dependent on the output signal from the amplifier (8), and a coupling path for coupling of the reception path (25) to the output from the amplifier (8). A control and evaluation means (34, 36) is additionally provided for adjustment of the predistorter (11, 12).

29 Claims, 5 Drawing Sheets

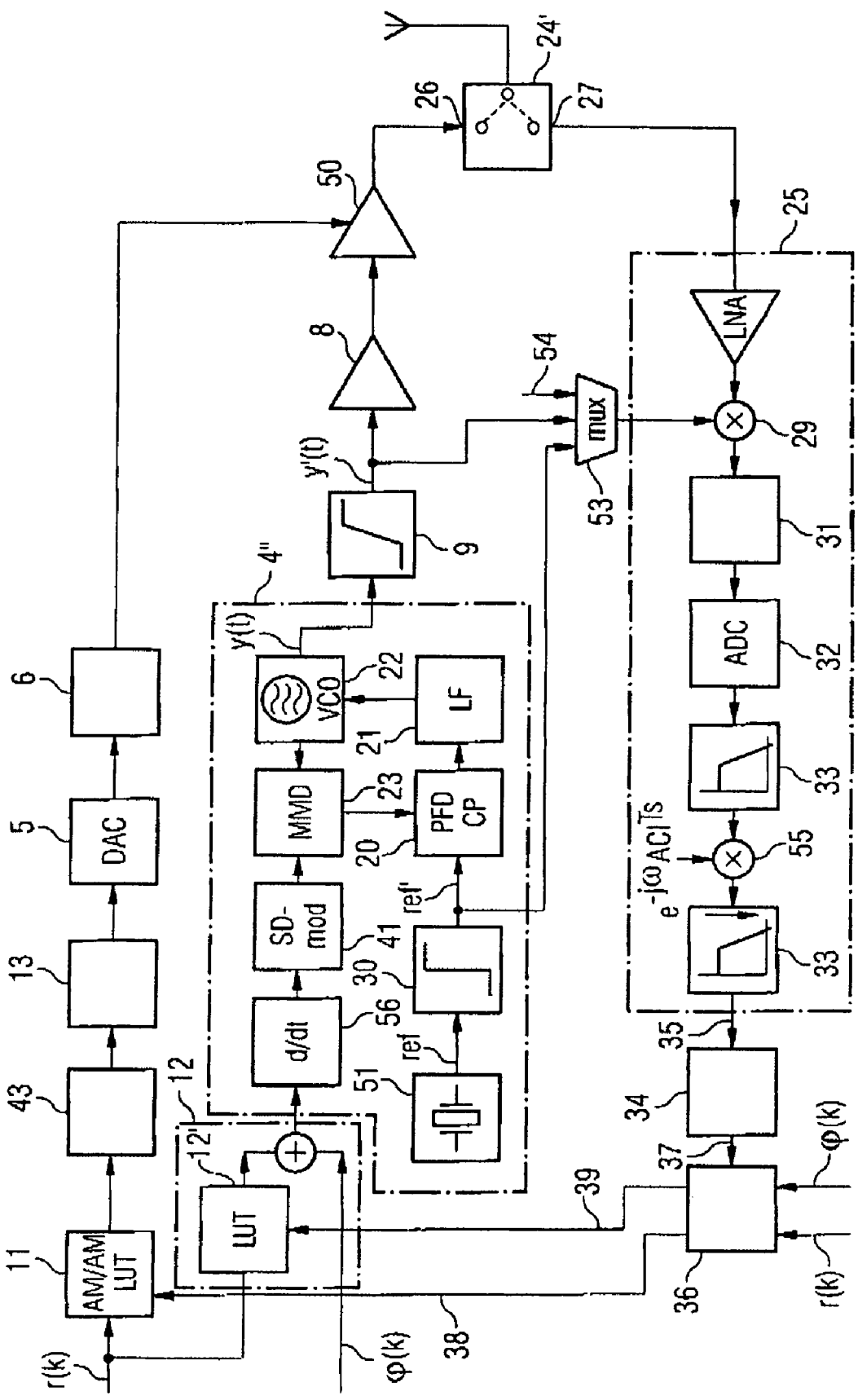

TRANSMITTING/RECEIVING DEVICE HAVING A POLAR MODULATOR WITH VARIABLE PREDISTORTION

PRIORITY

This application claims priority from German Patent Application No. 10 2005 006 162.1, which was filed on Feb. 10, 2005, and is incorporated herein by reference in its entirety.

TECHNICAL FIELD

The invention relates to a transmitting/receiving device for a mobile radio, which has a polar modulator, with the polar modulator having variable predistortion. The invention also relates to a method for adjustment of the predistortion in a polar modulator such as this.

BACKGROUND

The modulator in a transmitter in a mobile radio is used for transformation of the binary data stream to a modulated carrier signal. For this purpose, the binary data stream is first of all converted to complex-value digital data symbols as a function of the modulation type. The data symbols are then subjected to pulse shaping at the transmission end, in order to increase the spectral efficiency. The resultant baseband signal is then mixed with a carrier.

The modulator may in this case be in the form of an I/Q modulator or a polar modulator.

In the case of an I/Q modulator, the complex baseband signal is mixed in a Cartesian representation, separately on the basis of the real part and the imaginary part, with two orthogonal carrier signals. The real part and the imaginary part are also referred to as the I component (in phase) and the Q component (quadrature phase). The two resultant radio-frequency signals are then added and amplified. An I/Q modulator has the disadvantage in comparison to the polar modulator described in the following text that its power consumption is higher and it occupies more area on a chip.

In the case of a polar modulator, the complex baseband signal is processed in a polar representation separately on the basis of the amplitude and phase. FIG. 1 shows the outline circuit diagram of a polar modulator. A binary data stream b is first of all converted by means of a symbol mapper 1 to a complex-value symbol sequence a(k). The complex-value symbol sequence a(k) in this case comprises an I component and an Q component. The complex-value symbol sequence a(k) is then converted by means of a complex pulse shaping filter 2 to a complex baseband signal $x(k)=i(k)+jq(k)$. A digital computation circuit 3 is used to transform the complex baseband signal x(k) in a Cartesian representation to a corresponding signal $x(k)=r(k) \cdot e^{j\phi(k)}$ in polar representation. In this case, the variable r(k) describes an amplitude signal and the variable ($\phi(k)$) a phase signal.

An analogue carrier signal $y(t)\sim\cos(\omega_c \cdot t+\Phi(t))$ which is modulated as a function of the phase signal $\phi(k)$, is generated from the digital phase signal $\phi(k)$ by means of a step-up converter 4 which is based on a PLL (phase locked loop), in particular a directly modulated PLL. In this case, the variable $\omega_0$ corresponds to the carrier circular frequency. The phase $\Phi(t)$ is dependent on the phase signal $\phi(k)$ and the modulation type, for example phase modulation or frequency modulation). The digital amplitude signal r(k) is converted by a digital/analogue converter 5 to an analogue signal, which is then filtered by means of a noise filter 6 in order to reduce the quantization noise, with an analogue amplitude signal r(t) being produced. The analogue carrier signal y(t) and the analogue amplitude signal r(t) are multiplied by means of a multiplier 7. The multiplier 7 thus amplitude-modulates the analogue carrier signal y(t) as a function of the analogue amplitude signal r(t). The resultant signal $s(t)=r(t) \cdot y(t)$ is amplified by a power amplifier (not illustrated) before being transmitted via the antenna.

One embodiment of a polar modulator is illustrated in FIG. 2. Circuit parts and signals which are provided with the same reference symbols in FIG. 1 and FIG. 2 correspond to one another. In contrast to the polar modulator which is illustrated in FIG. 1, the amplitude modulation is in this case carried out only in the output stage of the power amplifier 8. For this purpose, the power gain of the power amplifier 8 is modulated via a modulation input 10 as a function of the analogue amplitude signal r(t). The supply voltage for the output stage of the power amplifier 8 is typically modulated in order to modulate the power gain. Alternatively, the quiescent currents of the output stage of the power amplifier, which govern the gain, may also be modulated. The supply voltage is modulated via an LDO voltage regulator (Low Dropout Regulator), which is not illustrated in FIG. 3. The polar modulator in FIG. 2 does not require the additional multiplier 7 as in FIG. 1.

One major advantage of the polar modulator illustrated in FIG. 2 over the polar modulator illustrated in FIG. 1 is that no linearity is required between the input signal y'(t) (y'(t) is generated by a limiting amplifier 9 from the signal y(t)) and the output signal from the power amplifier 8. The amplitude information r(k) in the symbols x(k) to be transmitted is not taken into account until the output stage, in any case. A polar modulator such as this operates particularly efficiently in power terms owing to the reduced linearity requirements on the power amplifier 8. The approach of not carrying out the amplitude modulation until the output stage of the power amplifier 8 is also referred to as the EER (Envelope Elimination and Restoration) method and is based on the publication "Single Sideband Transmission by Envelope Elimination and Restoration", L. Kahn, Proceedings of I.R.E., July 1952, pages 803 to 806. The polar modulator illustrated in FIG. 2 has the disadvantage that the output signal s(t) is distorted by the power amplifier 8. The power amplifier 8, in particular the analogue circuit components which follow the modulation input 10 as well as the analogue circuit parts which drive the modulation input 10, thus causes amplitude distortion, which is also referred to as AM-AM distortion (AM=Amplitude Modulation), that is to say the relationship between the amplitude of the output signal s(t) and the amplitude signal r(k) is not linear. Furthermore, the power amplifier 8 causes phase distortion, which is also referred to as AM-PM distortion (PM=Phase Modulation), that is to say an additional phase shift as a function of the amplitude of the amplitude signal r(k).

The document "Polar Modulator for Multi-mode Cell Phones", W. Sander et al., Proc. IEEE Custom Integrated Circuits Conf., September 2003, pages 439-445 discloses the digital amplitude signal r(k) and the digital phase signal $\phi(k)$ each being subjected to predistortion, so that the AM-AM distortion and the AM-PM distortion are compensated for. FIG. 3 illustrates a polar modulator which has had predistortion added to it, and is based on the polar modulator illustrated in FIG. 2. Circuit parts and signals which are provided with the same reference symbols in FIG. 2 and FIG. 3 correspond to one another. The polar modulator has a digital amplitude predistorter 11 and a digital phase predistorter 12, which compensate for the AM-AM distortion and the AM-PM distortion caused by the power amplifier 8.

The document U.S. Pat. No. 6,366,177 B1 describes an approach for adjustment of the predistortion. For this purpose, special measurement circuits are provided at the output of the power amplifier, which determine the amplitude and the phase modulation of the distorted radio-frequency signal s(t) with the phase modulation in each case fixed. The measured amplitude information and phase information are used to adjust the predistortion such that the distortion caused by the power amplifier is essentially compensated for. This approach has the disadvantage that the measurement circuit design involves a high degree of circuit complexity. In particular, step-down conversion of the radio-frequency signal s(t) to a baseband signal is first of all required, in order to determine the phase modulation.

SUMMARY

One object of the invention is to provide a transmitting/and receiving device having a polar modulator, whose predistortion can be adjusted with less circuit complexity than the conventional approaches. A further aim of the invention is to specify a corresponding method for adjustment of predistortion in a polar modulator in a transmitting/receiving device.

The objects on which the invention is based can be achieved by a transmitting/receiving device for a mobile radio, comprising a polar modulator which is based on the processing of a digital complex baseband signal in the form of a digital amplitude signal and a digital phase signal, and which comprises an amplifier for amplification of a radio-frequency signal which is dependent on the digital phase signal and whose output power can be modulated as a function of the digital amplitude signal, and at least one predistorter, which is connected upstream of the amplifier in the signal direction, for at least partial compensation for any distortion caused by the amplifier and with variable predistortion. The device further comprises a receiving path which is used both for reception of radio signals and for the purposes of adjustment of the at least one predistorter in order to determine a measurement signal which is dependent on the output signal from the amplifier, a coupling path for electrical coupling of the input of the reception path to the output of the amplifier for the purposes of adjustment of the at least one predistorter, and a control and evaluation means for adjustment of the at least one predistorter as a function of the measurement signal.

The coupling path may have a switchable coupling means. The polar modulator may comprise an amplitude predistorter with variable amplitude predistortion for at least partial compensation for any amplitude distortion caused by the amplifier, and a phase predistorter with variable phase predistortion for at least partial compensation for any phase distortion caused by the amplifier. The polar modulator may have a step-up converter, in particular in the form of a directly modulated PLL, for conversion of the digital phase signal or of a signal which is dependent on it to a modulated radio-frequency signal, and the reception path may have a step-down converter, whose local oscillator input is driven as a function of a radio-frequency signal which is generated by the step-up converter, in particular as a function of the modulated radio-frequency signal or of a signal which is dependent on the modulated radio-frequency signal. The polar modulator may have a step-up converter, in particular in the form of a directly modulated PLL, for conversion of the digital phase signal or of a signal which is dependent on it to a modulated radio-frequency signal, which step-up converter is synchronized via a reference signal with a reference frequency, the transmitting/receiving device may have a harmonic generator for generation of one or more harmonics of the reference frequency, and the reception path may have a step-down converter, whose local oscillator input is driven as a function of one or more of the harmonics which are produced by the harmonic generator. The control and evaluation means may comprise a means for comparison of the measurement signal or of a signal which is dependent on the measurement signal with the complex baseband signal, or a signal which is associated with the complex baseband signal. The measurement signal can be a complex digital signal in a Cartesian representation, and the control and evaluation means may have a transformation means for transformation of the measurement signal or of a signal which is dependent on it to a complex signal in a polar coordinate representation. The control and evaluation means may have a signal processing means, which produces a signal which is characteristic of the spectral spreading caused by the amplifier, as a function of the measurement signal. The measurement signal may essentially comprise spectral components of one or more frequency ranges which are outside the transmission channel, and the signal processing means may have a means for determination of a variable which is characteristic of the power in the frequency range or ranges outside the transmission channel. The transmitting/receiving device can be designed in such a way that the at least one predistorter is adjusted for each k-th transmitted data burst, where $k \geq 1$. The at least one predistorter can be based on a look-up table.

The object can also be achieved by a method for adjustment of the predistortion in a polar modulator for a transmitting/receiving device in a mobile radio, wherein the polar modulator is based on the processing of a digital complex baseband signal in the form of a digital amplitude signal and of a digital phase signal, the distortion is caused by an amplifier which is located in the polar modulator and amplifies a radio-frequency signal, which is dependent on the digital phase signal, and whose output power can be modulated as a function of the digital amplitude signal, the distortion can be at least partially compensated for by means of variable predistortion which precedes the distortion, and the output of the amplifier is or can be coupled to the input of a reception path, with the reception path being used not only for the purposes of adjustment of the predistortion but also for reception of radio signals. The method comprises the following steps: a) determining a measurement signal, which is dependent on the output signal from the amplifier, in the reception path; b) evaluating the measurement signal; and c) adjusting the predistortion on the basis of the evaluation result in method step b).

The method may comprise the following step, which should be carried out before method step a): coupling of the output of the amplifier to the input of the reception path. The predistortion may comprise variable amplitude predistortion for at least partial compensation for any amplitude distortion caused by the amplifier, and variable phase predistortion for at least partial compensation for any phase distortion caused by the amplifier. The method may comprise the following step which can be carried out in method step b): comparison of the measurement signal or of a signal which is dependent on it with the complex baseband signal, or a signal which is associated with the complex baseband signal. The measurement signal can be a digital complex signal in a Cartesian representation, and the following step is carried out in method step b): transformation of the measurement signal or of a signal which is dependent on it to a complex signal in a polar coordinate representation. The method may comprise the following step which can be carried out in method step b): b1)

determination of a signal which is characteristic of the spectral spreading caused by the amplifier, as a function of the measurement signal.

The method may comprise the following steps which can be carried out in method step b1): selection of a channel which is adjacent to the transmission channel, such that the measurement signal essentially comprises spectral components of a frequency range which is outside the transmission channel; and determination of a variable which is characteristic of the power in the frequency range outside the transmission channel. The predistortion can be adjusted for every k-th transmitted data burst, where $k \geq 1$. For the purposes of adjustment of the predistortion, the polar modulator may process a calibration signal, which is used only for the purposes of adjustment of the predistortion. For the purposes of adjustment of the predistortion, the polar modulator may also process a calibration signal with a staircase amplitude profile, which can be used only for the purposes of adjustment of the predistortion. For the purposes of adjustment of the predistortion, the polar modulator may processes a baseband signal, which is to be transmitted in the course of transmission.

The transmitting/receiving device according to the invention for a mobile radio has a polar modulator which is based on the EER method, that is to say the modulator has an amplifier which can be modulated. Furthermore, at least one predistorter, which is connected upstream of the amplifier in the signal direction, is provided, with the predistorter being variable. The predistorter is based, for example, on a look-up table. Furthermore, the transmitting/receiving device has a reception path which can optionally be used either for reception of radio signals or for the purposes of adjustment of the at least one predistorter. In the latter case, the reception path produces a measurement signal which is dependent on the output signal from the amplifier. Furthermore, a coupling path is provided in the transmitting/receiving device for adjustment of the at least one predistorter, and electrically connects the input of the reception path to the output from the amplifier. The transmitting/receiving device furthermore has a control and evaluation means, which is used for adjustment of the at least one predistorter as a function of the measurement signal.

One major idea of the transmitting/receiving device according to the invention is the dual use of the reception path. As part of the receiver, the reception path is used on the one hand for reception of radio signals, while on the other hand the reception path is used for adjustment of the at least one predistorter. In the second case, the output signal from the amplifier is injected into the reception path via the coupling path, with a measurement signal being generated in the course of signal processing in the reception path. The reception path is in this case typically used for step-down conversion of the injected distorted signal and, optionally, for subsequent analogue/digital conversion, with sample values of the I component and of the Q component of the baseband signal being determined, for example, as the measurement signal. The measurement signal can then be used as the basis for adjustment of the predistortion, for example in the course of a comparison of the measurement signal with the undistorted baseband signal, via the control and evaluation means, such that the distortion caused by the power amplifier is essentially compensated for.

Owing to the dual use of the reception path according to the invention, there is no need for the special measurement circuits as are provided in the prior art for determination of the amplitude and of the phase modulation of the distorted radio-frequency signal, so that the circuit complexity is considerably reduced.

At this point, it should be mentioned that the blocks in the reception path are not necessarily all used for adjustment of the predistortion. For example, there is generally no need for reception-end filters for channel equalization for the adjustment of the predistortion since, in this case, no signals are transmitted via the air channel.

The coupling path advantageously has a switchable coupling means, for example in the form of an MOS transistor (MOS—Metal Oxide Semiconductor) or an MOS transmission gate, which has a low impedance during the adjustment of the at least one predistorter, and a high impedance during normal reception. However, it is also feasible for the coupling path to be effective both during normal reception and during the adjustment of the at least one predistorter. This is the case when the coupling path is based on the parasitic coupling. For example, a duplexer has parasitic coupling between the transmitter connection and the receiver connection.

The polar modulator advantageously has a variable amplitude predistorter and a variable phase predistorter in order to compensate for both types of distortion, specifically AM-AM distortion and AM-PM distortion.

The polar modulator and the reception path typically have a step-up converter, in particular in the form of a directly modulated PLL or in the form of a mixer with a local oscillator generator and/or a step-down converter. The step-down converter is in this case used for conversion of the digital phase signal or of a signal which is dependent on it to a modulated radio-frequency signal.

In this case, according to a first advantageous embodiment, the LO input (LO: local oscillator) of the step-down converter is driven as a function of a radio-frequency signal which is generated by the step-up converter, in particular as a function of the modulated radio-frequency signal or of a signal which is dependent on the modulated radio-frequency signal.

This measure means that the polar modulator and the reception path operate synchronously in terms of frequency with one another. In this case, there is no need to determine the carrier frequency $f_c$ of the injected signal in the reception path. If the reception path is a homodyne reception path, in which the received signals are mixed to baseband without using an intermediate frequency, the mid-frequency of the injected signal can be down-converted directly to 0 Hz by mixing with an LO signal at the carrier frequency $f_c$. In the situation where the step-up converter is in the form of a directly modulated PLL, the PLL does not produce a monofrequency radio-frequency signal at the carrier frequency $f_c$, but just a modulated radio-frequency signal whose mid-frequency is $f_c$. In order to prevent self-mixing, the modulated radio-frequency signal can optionally be filtered with a narrow bandwidth before being fed to the LO input of the step-down converter, so that the modulation is suppressed.

In this context, it should be noted that the step-down converter for production of the I and Q signal components typically has two individual mixers which are driven via two mutually orthogonal LO signals, that is to say two radio-frequency signals are fed in via the LO input of the step-down converter (or the second orthogonal signal is generated internally in the step-down converter). If a frequency divider with a division ratio of 2 is used in the step-up mixer, this produces two orthogonal radio-frequency signals, without any additional circuit complexity (sample after the first latch and after the second latch of the frequency provider).

According to a second advantageous embodiment, the step-up converter is synchronized to a reference frequency via a reference signal, for example in the case of a directly modulated PLL with a frequency divider. The reference frequency is in this case generally considerably lower than the carrier frequency $f_c$; for example, the reference frequency is at 26 MHz, while the carrier frequency is at 910 MHz (division ratio 35:1). The transmitting/receiving device has a harmonic generator for generation of one or more harmonics of the reference frequency. The local oscillator input at the step-down converter is driven as a function of one or more harmonics which are produced by the harmonic generator. The harmonic generator is typically a square-wave generator, which produces a square-wave signal whose fundamental frequency corresponds to the reference frequency. In this case, the output signal has a so-called frequency comb with a large number of harmonics.

This alternative approach can be used in particular when the reception path is based on a heterodyne concept, for example in the case of a so-called low-IF receiver.

In this context, it should be noted that the output signal from the harmonic generator can also be used as the reference signal for the PLL.

The control and evaluation means advantageously has a comparison means, which carries out a comparison of the measurement signal (for example sample values of the I components and Q components of the baseband signal) or of a signal which is dependent on it with the complex baseband signal at the transmission end, or with a signal which is associated with the complex baseband signal at the transmission end. The two signals can be compared on the basis of Cartesian coordinates or alternatively on the basis of polar coordinates. Furthermore, the comparison may also relate only to the amplitude information.

The expression "comparison" for the purposes of the application also includes the evaluation of an error function of two comparison signals, for example in the form $|x-\bar{x}|^2$ (x: complex baseband signal, $\bar{x}$: complex measurement signal; alternatively: x: amplitude or phase of the complex baseband signal, $\bar{x}$ measured amplitude or measured phase).

The measurement signal is advantageously a complex digital signal in a Cartesian representation. In this case, it is advantageous for the control and evaluation means to have a transformation means for transformation of the measurement signal or of a signal which is dependent on it to a complex signal in a polar coordinate representation. In this case, the comparison is carried out on the basis of polar coordinates of the comparison signals, that is to say the transformed signal is then typically compared with the complex baseband signal on which the output signal from the amplifier is based.

Furthermore, for the purposes of the application, it is feasible for the transformation means to determine only the amplitude or the square of the amplitude of the complex measurement signal, with the comparison then being based only on the amplitude information, and not on the phase information.

Instead of the comparison means, a signal processing means may advantageously be provided in the control and evaluation means, which produces a signal which is characteristic of the spectral spreading caused by the amplifier, as a function of the measurement signal. This advantageous embodiment of the transmitting/receiving device is based on the idea that the nonlinearity of the amplifier leads to spreading of the transmission spectrum. This effect is also referred to as "spectral regrowth".

The degree of distortion of the output signal from the amplifier can be determined on the basis of the signal which is generated by the signal processing means. This information can be used to adjust at least one predistortion in such a way that the distortion in the output signal from the amplifier is minimized.

In this case, it is advantageous for the measurement signal to essentially have only spectral components in one or more frequency ranges which are outside the actual transmission channel. In the case of a homodyne receiver, by way of example, this can be achieved by means of an additional mixer whose LO frequency corresponds to the frequency offset relative to the mid-frequency of the transmission channel. Furthermore, the signal processing means as a means for determination of a variable which is characteristic of the power in the frequency range or ranges outside the transmission channel. The power determined in this way outside the actual transmission channel is a measure of the spectral spreading of the spectrum of the amplifier output signal, and is therefore also a measure of the distortion of the amplifier output signal. This information can be used to adjust the at least one predistorter in such a way as to minimize the distortion of the output signal from the amplifier.

In this context, it should be noted that the frequency ranges may be indefinitely narrow and, for example, may comprise one specific frequency. Furthermore, it would be feasible for the frequency ranges to be in the boundary areas of the transmission channel.

The predistortion may be adjusted on the one hand during factory tests and/or regularly whenever the transmitting/receiving device is switched on. The transmitting/receiving device is advantageously designed in such a way that the at least one predistorter is adjusted during operation of the transmitting/receiving device with a specific periodicity, in particular on each k-th data burst (k fixed and k≧1).

The AM-AM distortion and the AM-PM distortion in the amplifier are typically also dependent on external influencing variables such as the temperature and the operating voltage. If the predistorter is adjusted during operation of the transmitting/receiving device with a specific periodicity, the predistortion can be readjusted in the event of fluctuations in the external influencing variables, such as temperature fluctuations and supply voltage fluctuations. Temperature fluctuations may be measured, for example, by means of a monolithically integrated temperature sensor. If the temperature changes, the predistortion adjustment process can be carried out once again. In the same way, a voltage detector can be provided, which measures the supply voltage, with renewed adjustment of the predistortion likewise being initiated when the supply voltage changes.

The second aspect of the invention relates to a method for adjustment of the predistortion in an EER-based polar modulator. In this case, the distortion in the amplifier can be at least partially compensated for in the polar modulator by means of predistortion. The output from the amplifier is or can be coupled to the input of a reception path. The reception path is used not only for the purposes of adjustment of the predistortion but also during normal reception. In a first method step, a measurement signal which is dependent on the output signal from the amplifier is determined in the reception path. The measurement signal is evaluated, and the predistortion is adjusted on the basis of the evaluation result.

According to a first alternative refinement of the method according to the invention, the polar modulator processes a calibration signal, which is used only for adjustment of the predistortion, in the course of the adjustment of the predistortion. In particular, a calibration signal with a staircase amplitude profile is used for the adjustment of the predistortion.

If a calibration signal is used for the adjustment of the predistortion, the calibration signal, which in general does not comply with a standard, should be transmitted just at a very low power level, or not at all, in order to avoid interference with the mobile radio network. If a second amplifier is connected downstream from the amplifier of the transmitting/receiving device, it is expedient to deactivate the second amplifier during the adjustment of the predistortion.

According to a second alternative refinement of the method according to the invention, predistortion is adjusted for the purposes of normal transmission, that is to say polar modulator processes a baseband signal, to be transmitted in the course of transmission, rather than a calibration signal.

The above statements relating to the transmitting/receiving device according to the invention can be transferred analogously to the method according to the invention or adjustment of the predistortion.

Further advantageous refinements of the invention are specified in the dependent claims.

BRIEF DESCRIPTION OF THE DRAWINGS

The invention will be explained in more detail in the following text using a plurality of exemplary embodiments and with reference to the drawings, in which:

FIG. 7 shows a circuit diagram of a fourth exemplary embodiment of a transmitting/receiving device according to the invention.

DETAILED DESCRIPTION

Figure 1:
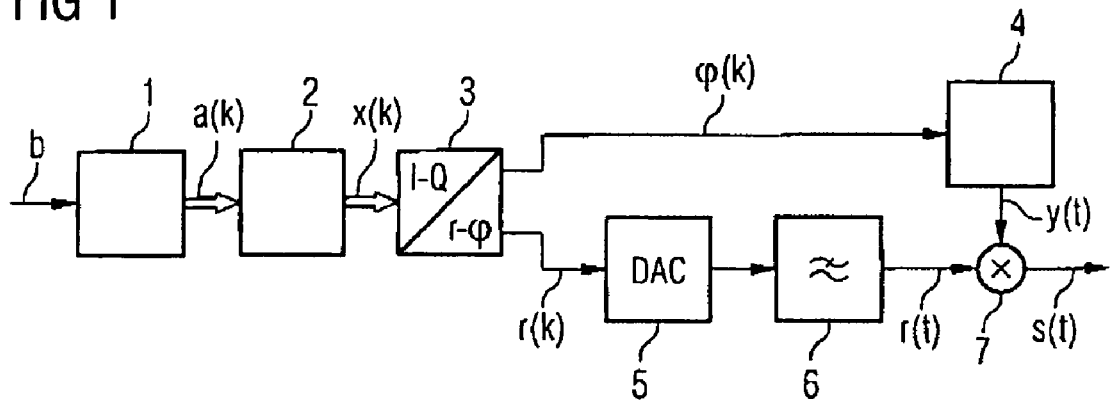
FIG. 1 shows an outline circuit diagram of a polar modulator (prior art)
Figure 2:
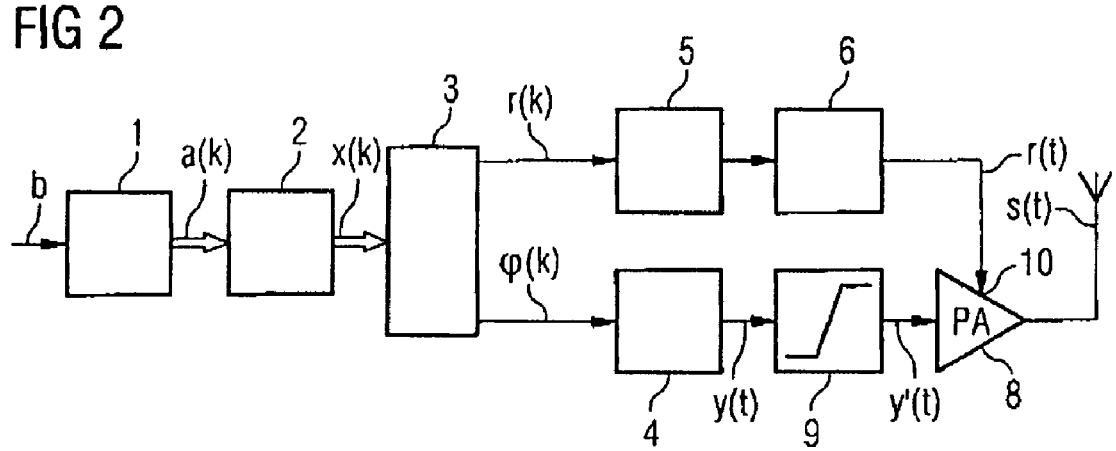
FIG. 2 shows an outline circuit diagram of a polar modulator which operates on the basis of a EER method (prior art)
Figure 3:
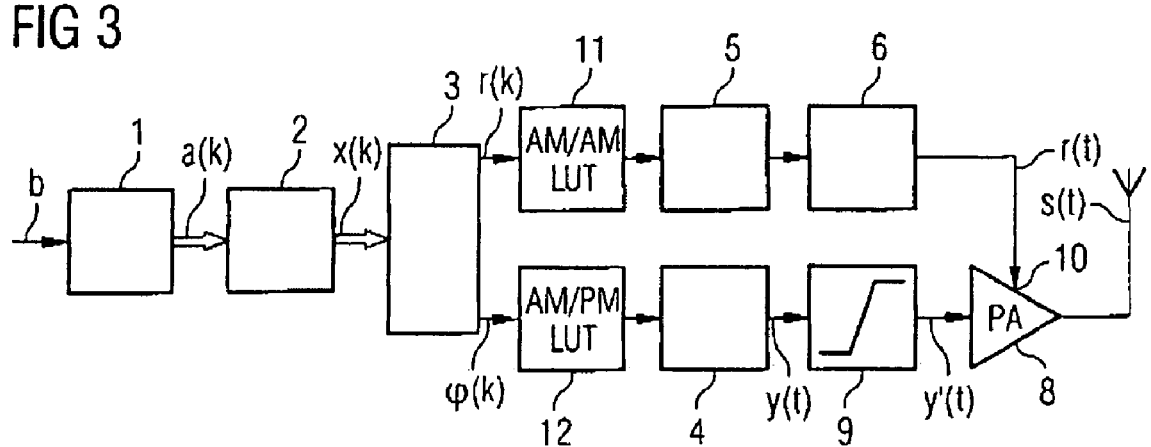
FIG. 3 shows an outline circuit diagram of a polar modulator which, in comparison to FIG. 2, has had predistortion added to it (prior art)

With regard to FIGS. 1 to 3, which relate to the prior art, reference should be made to the description introduction.

Figure 4:
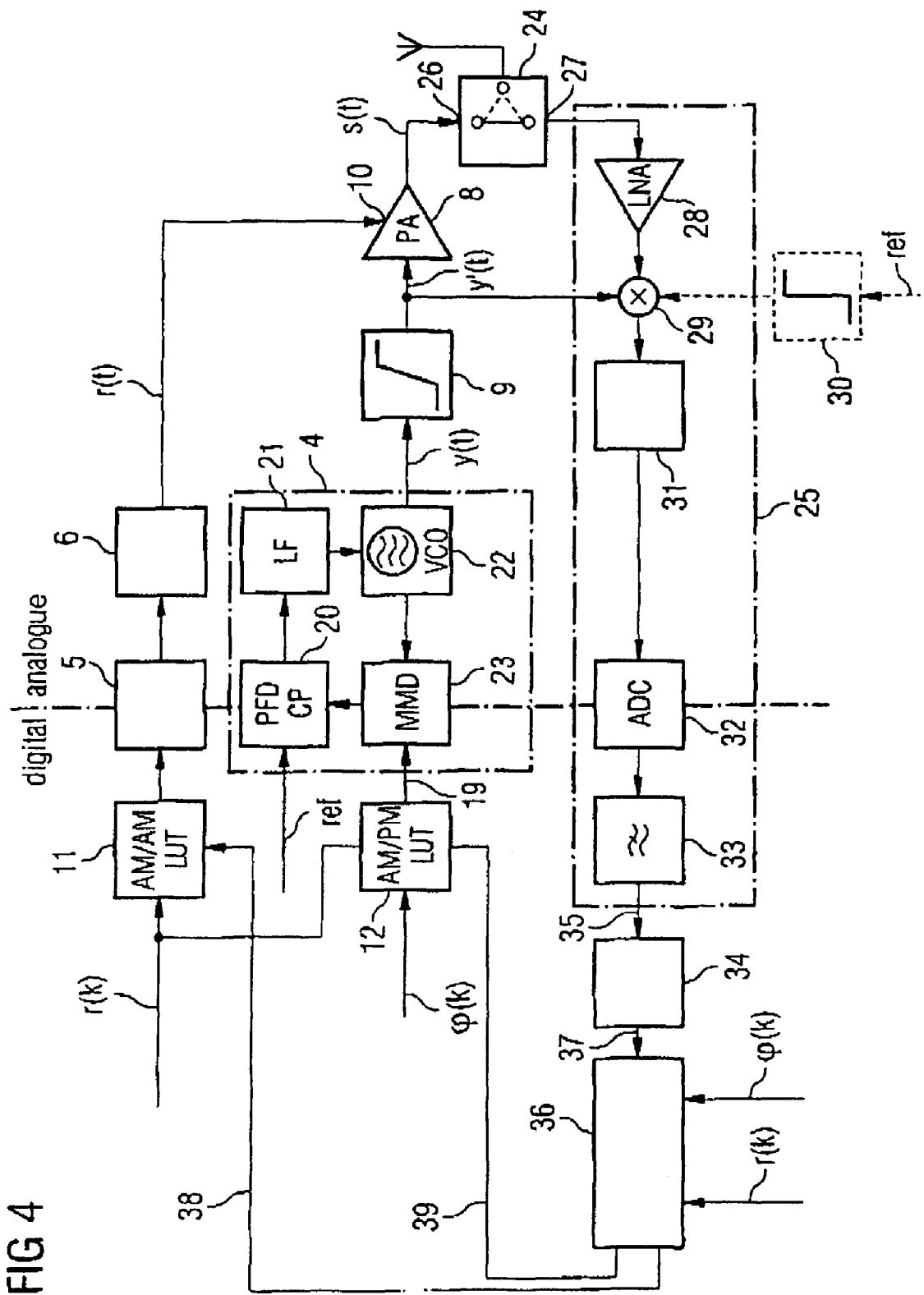
FIG. 4 shows a circuit diagram of a first exemplary embodiment of a transmitting/receiving device according to the invention.

FIG. 4 shows a circuit diagram of a first exemplary embodiment of a transmitting/receiving device according to the invention. Circuit blocks and signals which are provided with the same reference symbols in FIG. 3 and FIG. 4 correspond to one another. The step up converter 4 which is used at the transmission end in FIG. 4 is based on a directly modulated (PLL), which has a closed control loop which includes a phase frequency detector 20, a loop filter 21, a voltage controlled oscillator (VCO) 22 and a variable division ratio frequency divider 23. The frequency of the output signal y(t) from the directly modulated PLL is modulated via a modulation input 19. During steady-state operation of the PLL, the frequency $f_c$ of the signal y(t) at the output of the directly modulated PLL is given by:

$$f_c = N \cdot f_{ref}$$

In this case, $f_{ref}$ describes the frequency of the reference signal ref of the PLL, and N describes the division ratio of the frequency divider 23.

The amplitude predistorter 11 illustrated in FIG. 4 and the phase predistorter 12 illustrated in FIG. 4 may, for example, be in the form of look-up tables (LUT), with in each case one table value determining the predistortion of the amplitude or phase value as a function of the respective amplitude value. Alternatively, the predistorters 11 and 12 may be in the form of adaptive filters, in particular parametric filters, with the filter coefficients in this case determining the predistortion.

The output signal s(t) from the amplifier 10 is injected via a duplexer 24 into the reception path 25 of the transmitting/receiving device in order to adjust the predistorters 11 and 12 (loopback operating mode). Normally, a duplexer 24 selectively connects either the output of the power amplifier or the input of the reception path to the antenna. In the transmitting/receiving device according to the invention, it is possible to provide for the duplexer 24 to selectively connect the output of the power amplifier 10 to the input of the reception path in order to adjust the predistorters 11 and 12, that is to say the transmit input 26 and the receive output 27 of the duplexer 24 are connected to one another in order to adjust the predistorters 11 and 12. Alternatively, the parasitic coupling between the transmit input 26 and the receive output 27 of the duplexer 24 can be used for injection of the output signal s(t) from the power amplifier 8 into the reception path 25.

The signal which is injected into the reception path via the duplexer 24 is first of all amplified by means of a low noise amplifier (LNA) 28. If the input power is very high because the coupling path via the duplexer 24 has a low impedance, the LNA 28 can also be bridged, with the output signal from the first amplifier 8 being fed directly to the input of the step-down converter 29 (dashed link). In particular, this prevents overdriving of the LNA 28. If the output signal from the first amplifier 8 is fed directly to the input of the step-down converter 29, the LNA 28 should be switched off during the adjustment of the predistortion in order to achieve as high a degree of isolation from the antenna as possible since, otherwise, the reception path could be interfered if any radio interference signal is present.

In this context, it should be noted that the non-linearity of the reception path 25 should be considerably less than the non-linearity of the polar modulator. In particular, this can be achieved by optimally setting the gain in the reception path 25, in which case this optimum gain value is known a priori.

The resultant signal is supplied to a step-down converter which has a complex mixer 29, that is to say two real mixers. The two real mixers are driven in order to produce the I and the Q signal components of two orthogonal LO signals. In order to simplify the illustration, FIG. 4 shows only one LO signal. If a homodyne receiver architecture (zero-IF receiver) is being used, the LO signal can be derived from the modulated radio-frequency signal y(t) or y'(t) generated by the VCO 22. In order to prevent self-mixing, in which the phase information would be lost, the modulation should be removed from the modulated radio-frequency signal y(t) or y'(t) by means of a narrowband filter before being fed to the LO input of the step-down converter 29 (not illustrated). This can be achieved, for example, by using a narrowband PLL as a filter, with the modulated radio-frequency signal y(t) or y'(t) representing the reference signal for the narrowband PLL. If a complex mixer is used as the step-up converter 4, the unmodulated orthogonal LO signals which drive the complex mixer can be used without filtering in order to drive the LO input of the step-down converter 29.

If the receiver is in the form of a heterodyne receiver with a low intermediate frequency (low-IF receiver), the LO signal of the first complex mixer can alternatively also be derived from the reference signal ref for the PLL (illustrated by dashed lines). For this purpose, the reference signal ref is supplied to a square-wave generator 30, which produces a square-wave signal whose fundamental frequency corresponds to the reference frequency $f_{ref}$. The output signal from the square-wave generator 30 has a so-called frequency comb with a large number of harmonics of the reference frequency $f_{ref}$.

The complex output signal from the step-down converter 29 is first of all filtered by means of a complex polyphase filter 31 (typical bandwidth for a GSM application in the region of 200 kHz). Analogue/digital conversion is then carried out by means of the analogue/digital converter 32. The digital complex output signal from the analogue/digital converter 32 is then typically processed further by means of a plurality of filters 33 (only one filter is illustrated in FIG. 4). The output signal 35 from the filter chain 33 forms a measurement signal, which is produced by the reception path 25, with the measurement signal 25 being generated essentially with the aid of the circuit blocks which are used for normal reception in the reception path 25. The complex measurement signal 35, which is in a Cartesian representation, is then converted by means of a transformation means 34 to a complex signal 37 in a polar coordinate representation. Furthermore, averaging over time can be carried out when a staircase calibration signal is used in the circuit block 34.

The complex signal 37 is compared with the amplitude signal r(k) and with the phase signal φ(k) in the comparison means 36 in order to quantify the distortion. This can be carried out, in particular, by minimizing an error function, which is dependent on the signals to be compared, in the comparison means 36 for adjustment of the predistorters 11 and 12. By way of example, it is possible to minimize the error function $|x-\bar{x}|^2$ (x: scaled complex baseband signal, $\bar{x}$: scaled complex measurement signal 37 or 35, respectively). Alternatively, a corresponding error function based on the transmission-end amplitude signal and the measured envelopes can be used for determination of the table values for the AM-AM predistorter 11. During the comparison process, the comparison variables must be scaled in accordance with the gain and attenuation factors that occur in the transmission and reception path. This can be carried out by scaling of the received signal once. Furthermore, the comparison variables must be processed at the correct time with respect to one another.

In addition, the comparison in the comparison means 36 can also be carried out on the basis of complex comparison variables in a Cartesian representation.

Two control signals 38 and 39 are generated as a function of the value of the error function, with the control signal 38 being used to adjust the predistorter 11, and the control signal 39 being used to adjust the predistorter 12.

It is possible to provide for different parameter sets to be stored for each of the look-up tables, with in each case one parameter set being selected via the control signals 38 and 39. Each of the different parameter sets is in this case associated with a different non-linearity characteristic of the power amplifier 8.

If the predistorters 11 and 12 are in the form of digital parametric filters, the filter coefficients are modified via the control signals 38 and 39. By way of example, one coefficient set from a plurality of coefficient sets is in each case selected as a function of the control signals 38 and 39.

In conjunction with FIG. 4, it should be noted that the output power of the amplifier 8 is modulated by means of an LDO voltage regulator which is not illustrated in FIG. 4. This applies in the same way to the following exemplary embodiments.

Figure 5:
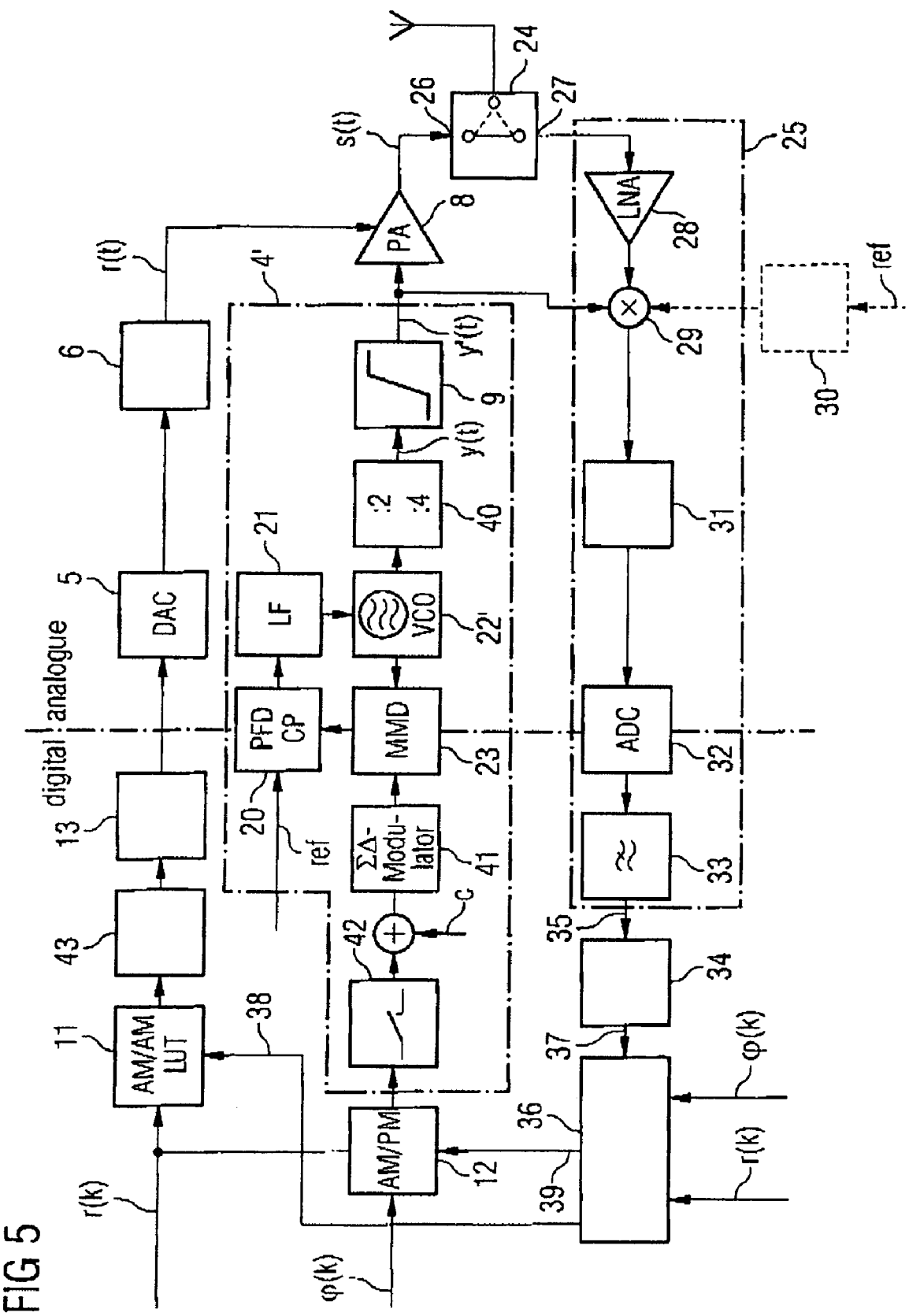
FIG. 5 shows a circuit diagram of a second exemplary embodiment of a transmitting/receiving device according to the invention for the GSM-900 and the GSM-1800 operating modes.

FIG. 5 shows a circuit diagram of a second exemplary embodiment of a transmitting/receiving device according to the invention for use in a GSM mobile telephone (GSM: Global System for Mobile Communications). Blocks and signals which are provided with the same reference symbols in FIG. 4 and FIG. 5 correspond to one another. This exemplary embodiment relates to a transmitting/receiving device which can be operated both in the GSM 900 mode that is to say in the frequency range around 900 MHz) and in the GSM-1800 mode (that is to say in the frequency range around 1800 MHz).

The compensation filter 42 is provided in order to increase the modulation bandwidth of the directly modulated PLL, with the transfer function of the compensation filter 42 corresponding approximately to the inverse of the transfer function of the PLL from the modulation input to the PLL output. The concept on which the compensation filter 42 is based is, for example, described in more detail in the dissertation "Techniques for High Data Rate Modulation and Low Power Operation of Fractional-N Frequency Synthesizers" by Michael Henderson Perrot, Massachussetts Institute of Technology, September 1997. A digital channel word c, which defines the carrier frequency $f_c$ being used, is superimposed on the output signal from the compensation filter 42. The sigma-delta modulator 41 which follows in the signal path uses the resultant digital signal to produce a signal which fluctuates with time, so that the division ratio N of the driven frequency divider 23 of the directly modulated PLL is effectively not a natural number, but a fractional number. A directly modulated PLL as illustrated in FIG. 5 is thus also referred to as a sigma-delta fractional N-PLL. A sigma-delta fractional N-PLL such as this has a lower noise level on the output side, since the use of the sigma-delta modulator 41 reduces the quantization noise. The VCO 22' in this case produces an output signal at twice GSM-1800 mode) or four times (GSM-900 mode) the frequency of the transmission signal s(t), depending on the GSM operating mode. In the GSM 900 mode, the frequency divider 40 which is connected downstream from VCO 22' has a division ratio of 4, while the frequency divider 40 operates with a division ratio of 2 in the GSM-1800 mode.

With respect to the amplitude modulation path, the output signal from the amplitude predistorter 11 is first of all supplied to a unit for offset correction 43. The resultant digital signal is subjected to interpolation and noise filtering (noise shaping) in a filter 13.

Figure 6:
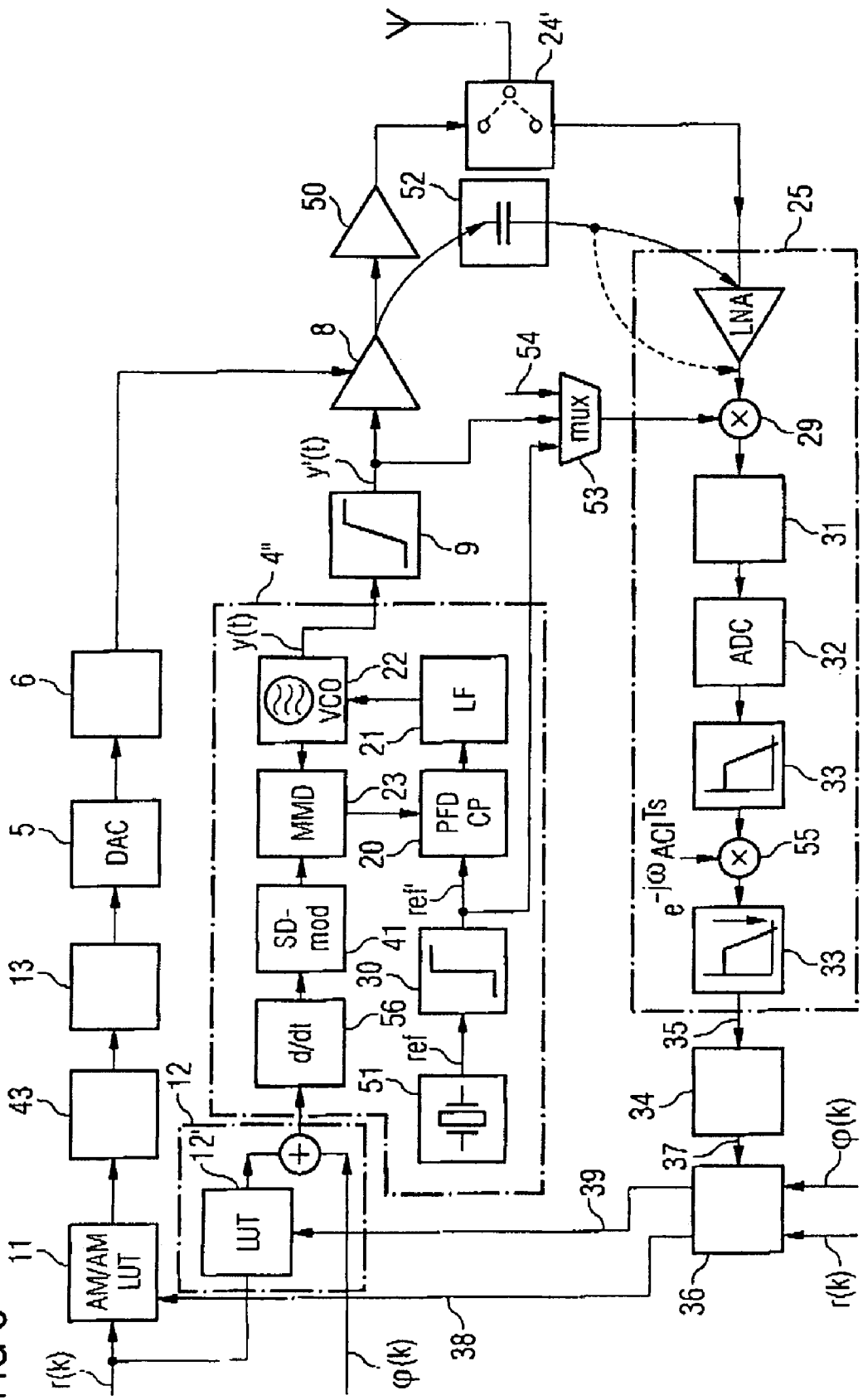
FIG. 6 shows a circuit diagram of a third exemplary embodiment of a transmitting/receiving device according to the invention.

FIG. 6 shows a circuit diagram of a third exemplary embodiment of a transmitting/receiving device according to the invention. Blocks and signals which are provided with the same reference symbols in FIG. 5 and FIG. 6 correspond to one another.

One major feature of this exemplary embodiment is the use of two amplifiers 8 and 50. In this case, the amplitude modulation is carried out only via the first amplifier 8. The first amplifier 8 is in this case integrated on a single chip using CMOS semiconductor technology together with the other blocks illustrated in FIG. 6 (excluding the duplexer 24', which can be switched only between transmission and reception, the second amplifier 50 and the crystal oscillator 51). The second amplifier 50, in contrast, is designed using bipolar or GaAs-FET semiconductor technology. Although the level at the input of the second amplifier 50 is higher than at the input of the first amplifier 8, the signal distortion is in general caused mainly by the first amplifier 8, since an amplifier using CMOS semiconductor technology has a narrower linearity range than a corresponding amplifier using bipolar or GaAs-FET semiconductor technology for a comparable structure resolution.

For adjustment of the predistorters 11 and 12, it is thus often sufficient to measure the distortion of the output signal from the first amplifier 8, instead of the distortion of the output signal from the second amplifier 50. The output signal from the first amplifier 8 is injected in a corresponding manner via a coupling means 52 into the input of the reception path 25, with a coupling capacitance being used, in particular, for this purpose. The injection process may be designed to be switchable. By way of example, a switchable MOS transistor (MOS—metal oxide semiconductor) or an MOS transmission gate may be used for this purpose, and is arranged in series with the coupling capacitance.

The LO signal of the step-down converter 29 can be chosen by means of a multiplexer 53. The LO signal of the step-down converter 29 is optionally derived from the square-wave signal ref', whose fundamental frequency corresponds to the reference frequency $f_{ref}$, or from the modulated radio-frequency signal y'(t). Alternatively, an external LO signal 54 can also be chosen to drive the step-down converter 29 via the multiplexer 53. By way of example, the external LO signal 54 can be used for factory adjustment of the predistorters 11 and 12.

If a calibration signal which does not comply with a standard is used for adjustment of a predistortion, the second amplifier 50 should be deactivated during any adjustment of the predistortion carried out by a user (that is to say not at the factory), in order to prevent interference with the mobile radio network.

The digital frequency converter 55 illustrated in FIG. 6 is not used during the analysis of the measurement signal 35 as described above, that is to say this represents a short circuit in this case.

As an alternative to the analysis of the measurement signal, as described above, in the form of a signal comparison, the spectral spreading of the output signal from the first amplifier 8 may be determined in order to adjust the predistorters 11 and 12. The blocks which are required for this alternative signal evaluation are not illustrated, except for the digital frequency converter 55 in FIG. 6. For this purpose, an adjacent channel is selected by means of the frequency converter 55 via the choice of the circular frequency $\omega_{Ac1}$, for example a channel with is adjacent but one to the transmission channel. The frequency $f_{Ac1} = \omega_{Ac1}/2\pi$ (for example $f_{Ac1} \sim 400$ kHz) corresponds in the case of a homodyne receiver structure to the frequency offset from the carrier frequency $f_c$. The measurement signal 35 in this case comprises only the spectral components of the selected adjacent channel. Spectral components which are located outside this band are suppressed by the filter 33 which is connected downstream from the frequency converter 35. The power of the measurement signal 35 and thus the power in the selected adjacent channel are determined by means of a signal processing means (not illustrated). The control signals 38 and 39 are selected such that the determined power of the selected adjacent channel, and thus also the spectral spreading, are as small as possible. When determining the spectral spreading by means of a measurement of the adjacent channel power, it is necessary to take into account the absolute power of the output signal from the first amplifier 8.

Instead of a power measurement of an entire adjacent channel, the spectral power density can also be determined at a single frequency (or at a discrete frequency point), for example at a frequency offset of 400 kHz.

The measurement of the spectral spreading, in particular, can be carried out during normal operation of the mobile radio with a baseband signal x(k) which complies with a standard. In this case, the second amplifier 50 is activated.

FIG. 6 also shows an implementation example for a phase predistorter 12. This exemplary implementation can also be transferred in a corresponding manner to the exemplary embodiments in FIGS. 4 and 5. Phase correction values are selected from a look-up table 12' as a function of the amplitude signal r(k), and have a phase signal φ(k) additively superimposed on them.

The differentiator 56 which follows the phase predistorter 12 as part of the step-up converter 4" is used to convert the phase information to frequency information, since the frequency of the directly modulated PLL is modulated via the frequency divider 23. The differentiator 56 has not been illustrated in FIGS. 4 and 5, for simplicity reasons.

FIG. 7 shows a circuit diagram of a fourth exemplary embodiment of a transmitting/receiving device according to the invention. Blocks and signals which are provided with the same reference symbols in FIG. 6 and FIG. 7 correspond to one another. The major difference between the exemplary embodiment in FIG. 6 and the exemplary embodiment in FIG. 7 is that the output signal from the second amplifier 50 in FIG. 7 is injected into the reception path in order to adjust the predistorters 11 and 12. The parasitic coupling path between the transmit input 26 and the receive output 27 of the duplexer 24' is used for signal injection.

What is claimed is:

1. A transmitting/receiving device for a mobile radio, comprising:
    a polar modulator which is based on the processing of a digital complex baseband signal in the form of a digital amplitude signal and a digital phase signal, and which comprises
        an amplifier for amplification of a radiofrequency signal which is dependent on the digital phase signal and whose output power can be modulated as a function of the digital amplitude signal,
        at least one predistorter, which is connected upstream of the amplifier in the signal direction, for at least partial compensation for distortion caused by the amplifier and with variable predistortion, and
        a step-up converter, in the form of a directly modulated PLL, for conversion of the digital phase signal or of a signal which is dependent on it to a modulated radio-frequency signal, which step-up converter is synchronized via a reference signal with a reference frequency,
    a harmonic generator for generation of one or more harmonics of the reference frequency,
    a receiving path which is used both
        for reception of radio signals and
        for the purposes of adjustment of the at least one predistorter in order to determine a measurement signal which is dependent on the output signal from the amplifier wherein the reception path has a step-down converter, whose local oscillator input is driven as a function of one or more of the harmonics which are produced by the harmonic generator
    a coupling path for electrical coupling of the input of the reception path to the output of the amplifier for the purposes of adjustment of the at least one predistorter, and
    a control and evaluation means for adjustment of the at least one predistorter as a function of the measurement signal.

2. A transmitting/receiving device according to claim 1, wherein the coupling path has a switchable coupling means.

3. A transmitting/receiving device according to claim 1, wherein the polar modulator comprises:

an amplitude predistorter with variable amplitude predistortion for at least partial compensation for amplitude distortion caused by the amplifier, and a phase predistorter with variable phase predistortion for at least partial compensation for phase distortion caused by the amplifier.

4. A transmitting/receiving device according to claim 1, wherein the local oscillator input of the step-down converter is driven as a function of a radio-frequency signal which is generated by the step-up converter, as a function of the modulated radio-frequency signal or of a signal which is dependent on the modulated radio-frequency signal.

5. A transmitting/receiving device according to claim 1, wherein the control and evaluation means comprises a means for comparison of the measurement signal or of a signal which is dependent on the measurement signal with the complex baseband signal, or a signal which is associated with the complex baseband signal.

6. A transmitting/receiving device according to claim 5, wherein the measurement signal is a complex digital signal in a Cartesian representation, and the control and evaluation means has a transformation means for transformation of the measurement signal or of a signal which is dependent on it to a complex signal in a polar coordinate representation.

7. A transmitting/receiving device according to claim 1, wherein the control and evaluation means has a signal processing means, which produces a signal which is characteristic of the spectral spreading caused by the amplifier, as a function of the measurement signal.

8. A transmitting/receiving device according to claim 7, wherein the measurement signal essentially comprises spectral components of one or more frequency ranges which are outside the transmission channel, and the signal processing means has a means for determination of a variable which is characteristic of the power in the frequency range or ranges outside the transmission channel.

9. A transmitting/receiving device according to claim 1, wherein the transmitting/receiving device is designed in such a way that the at least one predistorter is adjusted for each k-th transmitted data burst, where k≧1.

10. A transmitting/receiving device according to claim 1, wherein the at least one predistorter is based on a look-up table.

11. A transmitting/receiving device according to claim 1, wherein the harmonic generator is a square-wave generator.

12. A transmitting/receiving device according to claim 11, wherein the reference signal is supplied to the square-wave generator, which produces a square-wave signal having a fundamental frequency which corresponds to the reference frequency.

13. A transmitting/receiving device according to claim 12, wherein the square-wave signal is used as the reference signal for the step-up converter.

14. A transmitting/receiving device according to claim 12, wherein an LO signal is fed in via the local oscillator input of the step-down converter, wherein the LO signal is selected via a multiplexer such that the LO signal is derived from the square-wave signal or from the modulated radio-frequency signal or from an external LO signal.

15. A transmitting/receiving device according to claim 1, wherein the coupling path comprises a duplexer to connect the output of the amplifier to the input of the receiving path by selectively connecting a transmit input and a receive output of the duplexer to one another or by using a parasitic coupling between the transmit input and the receive output of the duplexer.

16. A transmitting/receiving device according to claim 1, wherein the amplifier comprises a first amplifier and a second amplifier which are connected in series, and wherein the first amplifier, the polar modulator, the at least one predistorter, the receiving path and the control and evaluation means are integrated on a single chip.

17. A transmitting/receiving device according to claim 16, wherein the first amplifier uses CMOS semiconductor technology and the second amplifier uses bipolar or GaAs-FET semiconductor technology such that a signal distortion is caused mainly by the first amplifier.

18. A transmitting/receiving device according to claim 16, comprising:

coupling means connected between an output of the first amplifier and the input of the receiving path for injecting an output signal from the first amplifier into the input of the receiving path, wherein the coupling means comprises a coupling capacitance and a switchable MOS transistor or MOS transmission gate arranged in series.

19. A method for adjustment of the predistortion in a polar modulator for a transmitting/receiving device in a mobile radio, wherein the polar modulator is based on the processing of a digital complex baseband signal in the form of a digital amplitude signal and of a digital phase signal, the distortion is caused by an amplifier which is located in the polar modulator and amplifies a radio-frequency signal, which is dependent on the digital phase signal, and whose output power can be modulated as a function of the digital amplitude signal, the polar modulator has a step-up converter, in the form of a directly modulated PLL, for conversion of the digital phase signal or of a signal which is dependent on it to a modulated radio-frequency signal, the distortion can be at least partially compensated for by means of variable predistortion which precedes the distortion, and the output of the amplifier is or can be coupled to the input of a reception path, with the reception path being used not only for the purposes of adjustment of the predistortion but also for reception of radio signals, the reception path having a step-down converter; the method comprising the following steps:

a) determining a measurement signal, which is dependent on the output signal from the amplifier, in the reception path;

b) evaluating the measurement signal;

c) adjusting the predistortion on the basis of the evaluation result in method step b);

d) sycronizing the step-up converter in the polar modulator via a reference signal with a reference frequency;

e) generating, with a harmonic generator in the transmitting/receiving device, one or more harmonics of the reference frequency; and f) driving a local oscillator input to the step-down converter in the reception path as a function of one or more of the harmonics which are produced by the harmonic generator.

20. A method according to claim 19, comprising the following step, which should be carried out before method step a):

coupling of the output of the amplifier to the input of the reception path.

21. A method according to claim 19, wherein the predistortion comprises variable amplitude predistortion for at least partial compensation for amplitude distortion caused by the amplifier, and variable phase predistortion for at least partial compensation for phase distortion caused by the amplifier.

22. A method according to claim 19, wherein the following step is carried out in method step b):

comparison
of the measurement signal or of a signal which is dependent on it, with
the complex baseband signal, or a signal which is associated with the complex baseband signal.

23. A method according to claim 22, wherein
the measurement signal is a digital complex signal in a Cartesian representation, and
the following step is carried out in method step b):
transformation of the measurement signal or of a signal which is dependent on it to a complex signal in a polar coordinate representation.

24. A method according to claim 19, wherein the following step is carried out in method step b):

b1) determination of a signal which is characteristic of the spectral spreading caused by the amplifier, as a function of the measurement signal.

25. A method according to claim 24, wherein the following steps are carried out in method step b1):

selection of a channel which is adjacent to the transmission channel, such that the measurement signal essentially comprises spectral components of a frequency range which is outside the transmission channel; and determination of a variable which is characteristic of the power in the frequency range outside the transmission channel.

26. A method according to claim 19, wherein the predistortion is adjusted for every k-th transmitted data burst, where $k \geq 1$.

27. A method according to claim 19, wherein, for the purposes of adjustment of the predistortion, the polar modulator processes a calibration signal, which is used only for the purposes of adjustment of the predistortion.

28. A method according to claim 19, wherein, for the purposes of adjustment of the predistortion, the polar modulator processes a calibration signal with a staircase amplitude profile, which is used only for the purposes of adjustment of the predistortion.

29. A method according to claim 19, wherein, for the purposes of adjustment of the predistortion, the polar modulator processes a baseband signal, which is to be transmitted in the course of transmission.

* * * * *